United States Patent
Blackmore

(10) Patent No.: US 10,052,712 B2
(45) Date of Patent: Aug. 21, 2018

(54) METHOD OF MANUFACTURING A COMPONENT

(71) Applicant: ROLLS-ROYCE PLC, London (GB)

(72) Inventor: Michael Lewis Blackmore, Sheffield (GB)

(73) Assignee: ROLLS-ROYCE PLC, London (GB)

( * ) Notice: Subject to any disclaimer, the term of this patent is extended or adjusted under 35 U.S.C. 154(b) by 873 days.

(21) Appl. No.: 14/337,528

(22) Filed: Jul. 22, 2014

(65) Prior Publication Data
US 2015/0037601 A1 Feb. 5, 2015

(30) Foreign Application Priority Data
Aug. 2, 2013 (GB) .................................. 1313841.7

(51) Int. Cl.
*B23K 15/00* (2006.01)
*B22F 3/105* (2006.01)
(Continued)

(52) U.S. Cl.
CPC ........ *B23K 15/0086* (2013.01); *B22F 3/1055* (2013.01); *B23K 15/002* (2013.01);
(Continued)

(58) Field of Classification Search
CPC .. B23K 26/342; B23K 15/00; B23K 15/0046; B23K 15/0086
(Continued)

(56) References Cited

U.S. PATENT DOCUMENTS

2004/0019403 A1* 1/2004 Liu .................... B41J 2/161
700/166
2005/0173380 A1 8/2005 Carbone
(Continued)

FOREIGN PATENT DOCUMENTS

DE 10 2011 006 941 A1 5/2012
WO WO 2011/110521 A1 9/2011
WO WO 2012/069037 A2 5/2012

OTHER PUBLICATIONS

Jan. 13, 2015 Search Report issued in EP Application No. 14178257.
(Continued)

Primary Examiner — Michael Laflame, Jr.
(74) Attorney, Agent, or Firm — Oliff PLC

(57) ABSTRACT

A method of manufacturing and measuring the geometry of at least a part of a component, and a method of manufacturing a component, both include providing a powder layer to a melt region; selectively melting the powder layer using an energy source, the melted powder subsequently solidifying to form a solid layer; scanning the melt region, including the solid layer, using a scanning electron beam; detecting backscattered electrons resulting from the interaction of the scanning electron beam with the melt region; determining the geometry of the solid layer from the detected backscattered electrons; and storing data relating to the determined geometry of the solid layer. The methods may also include adjusting parameters of the steps of providing a powder layer and/or selectively melting the powder layer to avoid future recurring errors, or generating a virtual 3-D model of the manufactured component, using the stored data.

20 Claims, 5 Drawing Sheets

(51) Int. Cl.
*B29C 67/00* (2017.01)
*H01J 37/28* (2006.01)
*B33Y 10/00* (2015.01)

(52) U.S. Cl.
CPC .......... *B29C 67/0077* (2013.01); *B33Y 10/00* (2014.12); *H01J 37/28* (2013.01); *B22F 2003/1056* (2013.01); *B22F 2998/00* (2013.01); *Y02P 10/295* (2015.11); *Y10T 428/12389* (2015.01)

(58) Field of Classification Search
USPC ... 219/121.6, 121.7, 121.35, 121.65, 121.66, 219/121.83, 121.85
See application file for complete search history.

(56) References Cited

U.S. PATENT DOCUMENTS

| | | | |
|---|---|---|---|
| 2008/0154423 A1* | 6/2008 | Badarinarayan | B23K 31/125 700/175 |
| 2013/0055568 A1 | 3/2013 | Dusel et al. | |
| 2013/0280439 A1 | 10/2013 | Hess et al. | |

OTHER PUBLICATIONS

Mar. 21, 2014 British Search Report issued in British Application No. 1313841.7.

* cited by examiner

METHOD OF MANUFACTURING A COMPONENT

CROSS-REFERENCE TO RELATED APPLICATIONS

This application is based upon and claims the benefit of priority from British Patent Application Number 1313841.7 filed 2 Aug. 2013, the entire contents of which is incorporated by reference.

BACKGROUND OF THE INVENTION

1. Field of the Disclosure

The present invention relates to a method of manufacturing a component. In particular, the present invention relates to manufacturing a component using additive layer manufacture.

2. Description of the Related Art

Additive layer manufacturing (ALM) methods using electron beam melting (EBM) may be used to manufacture metallic components by sequential selective melting of thin metal powder layers. According to such a method, a layer of metal powder is deposited onto a surface (or plate), and an electron beam is used to selectively melt the powder layer. The melted material then solidifies so as to form a metallic layer of the desired shape. A further layer of powder is then deposited, and the electron beam is used to selectively melt the further powder layer, which then solidifies to form another metallic layer of the desired shape onto the previous metallic layer. The process is repeated until the final 3D geometry has been built up by selective melting and solidification of multiple layers.

The process can operate directly from a 3D CAD model of the geometry to be manufactured, and may not require any specific tooling to be produced for a particular geometry or component. Accordingly, ALM can be used to generate parts having complex 3D free-form geometry, with short lead times.

Typically, a 3D CAD model of the geometry to be produced is virtually sliced into a series of thin, pseudo 2D, slices equal to the layer thickness generated when a single powder layer is melted (for example by a laser beam) and then solidifies. In the case of EBM, the thin slices of the geometry are then used to generate an electron beam melting path for each layer. This process may be used as part of or along with the present invention.

Any desired path may be used for melting each layer. For example, the contour (or outline) of the layer may first be melted by a beam, and then the bulk of the layer may be melted, for example by hatching, i.e. rastering the beam back and forth along parallel vectors. Once a layer has been completed, the partially manufactured component may be stepped downwards, away from the energy source (for example the electron beam), to allow the next powder layer to be deposited and melted.

OBJECTS AND SUMMARY

Manufacturing components using ALM has many advantages, including the possibility to manufacture complex 3D shapes with little or no bespoke tooling, but the final components may not consistently have the desired geometric and/or mechanical properties. The finished component may be outside the design geometric tolerance of the component, for example if one or more of the many parameters of the ALM process, including those associated with the powder delivery and selective melting steps, is not set appropriately. The high levels of energy involved in the ALM process may lead to unwanted and/or unaccounted distortion in the component during manufacture. Furthermore, geometric differences may occur between two different versions of the same component manufactured on the same machine with the same process parameters simply as a result of the stochastic natural of distributing and melting tens of millions of powder grains with small (unwanted) variations in process parameters and powder particles.

Accordingly, the components manufactured using ALM need to be inspected to ensure that they are within the geometrical tolerance. Conventionally, this is performed by a coordinate measuring machine (CMM), which uses a touch probe to inspect the geometry of the finished component. It may then be determined whether the component is within the necessary geometrical tolerance. This extra inspection step requires the use of an additional machine, and adds significant time to the manufacture of each and every component. Furthermore, the inspection may reveal that at least some of the components may not be within the allowable geometric tolerance, meaning that those fully manufactured components may become scrap.

It is therefore desirable to produce components using ALM that have better geometric tolerance.

According to an aspect, there is provided a method of manufacturing and measuring the geometry of at least a part (for example all or a part of) of a component using additive layer manufacture. The method comprises providing a powder layer. The powder layer is delivered to a melt region. The method comprises selectively melting the powder layer using an energy source. The melted powder subsequently solidifies to form a solid layer. The method comprises scanning the melt region, including the solid layer, using a scanning electron beam. The method comprises detecting backscattered electrons resulting from the interaction of the scanning electron beam with the melt region. The method comprises determining the geometry of the solid layer from the detected backscattered electrons.

According to an aspect, there is provided an additive layer manufacture (ALM) machine for manufacturing a component comprising a powder delivery device for delivering successive layers of powder to a melt region. The ALM machine comprises an energy source for selectively melting at least a part of each powder layer so as to produce a solid layer of the component. The ALM machine comprises an electron beam source for generating a scanning electron beam to scan each melt region, including its respective solid layer. The ALM machine comprises a backscatter detector for receiving backscattered electrons resulting from the interaction between the electron beam and the melt region, including the solid layer. The backscatter detector may be any suitable type of backscatter detector. The detected electrons allow the geometry of the solid layer to be determined. The ALM machine may comprise a base plate on which at least the first layer of powder is delivered, and/or on which the component is manufactured.

The melt region may refer to the region to which the most recent layer of powder 500 is delivered and/or to the region onto which the energy source may perform selective melting. After selective melting has been performed, the melt region may include both the unmelted powder and the solid layer. Thus, the melt region may refer to the top layer, which may comprise powder and/or solid, of a powder bed being used to manufacture the component.

The energy source used to selectively melt the powder layer(s) may be an energy beam. For example, the energy source may be a laser or an electron beam, which may be referred to as a melting electron beam. As such, the ALM machine may be an electron beam melting (EBM) machine, and/or the method may be performed using an EBM machine.

The ALM/EBM machines/methods according to the present invention allow in-situ inspection of a component as it is being manufactured. For example, the geometry (or shape) of the component can be measured in-situ during manufacture. For example, the geometry of each solid layer can be determined before the next layer of powder is supplied and melted. This may help to reduce the number/percentage of defective (for example scrap) components that are generated using ALM/EBM techniques, resulting in cost and/or efficiency savings. If a defect or error in the component geometry is detected during the manufacturing process rather than after the manufacturing process, a decision on the fate of the component (for example scrap, fixable, within tolerance) can be made before the remainder of the component is manufactured. This may further add to cost and/or efficiency savings. Measuring the geometry of the component during manufacture may additionally or alternatively remove the need for a separate measuring step (for example using CMM) after manufacture of the component.

The determined geometry of the solid layer may be compared with desired geometry of the solid layer. A decision may then be taken with regard to whether the determined geometry is within an allowable tolerance of the desired geometry. If the determined geometry is within the allowable tolerance, the steps outlined herein may be repeated for at least one further powder layer. Thus, at least one further solid layer of the component may be produced and geometrically inspected.

If the determined geometry is outside the allowable tolerance, the method may comprise deciding whether the determined geometry is correctable so as to become within the allowable tolerance (for example by determining whether the geometry is within a correctable tolerance and/or deciding whether the geometry is correctable based on the size and/or shape and/or location of the error in the geometry). If the determined geometry is deemed to be correctable, the geometry of the solid layer may be corrected so as to be within the allowable tolerance. The steps outlined herein may then be repeated for at least one further powder layer. Thus, at least one further solid layer of the component may be produced and geometrically inspected. In this way, components that may otherwise be out of tolerance when completed may be corrected in-situ such that the finished component is within the desired tolerance.

If it is decided that the determined geometry is not correctable (for example if it is outside a correctable tolerance), no further powder layers may be provided and the manufacture of the component stops. This may prevent wasting of material and/or time and/or energy on part made components that would ultimately become scrap components.

The decision regarding whether the determined geometry is correctable (and if so how to correct it) may be taken by a machine (such as a control unit or processor), for example based on the desired and determined geometry and/or without human intervention. Thus, the decision may be an automatic decision, which may be based on one or more criteria, such as those described above and elsewhere herein.

Alternatively, the decision may be taken by an operator of the machine. Alternatively still, the decision may be taken by a combination of machine and operator. For example, the machine may automatically identify potentially correctable errors in the geometry, and an operator may take the final decision on whether any corrective action is taken.

If the determined geometry is deemed to be correctable, the solid layer may be corrected at least in part using the energy source. For example, additional powder may be melted and/or previously melted and solidified material may be re-melted in order to modify the layer so as to be within an acceptable tolerance.

After comparing the determined geometry of the solid layer with desired geometry of the solid layer, the method may comprise adjusting one or more parameters of the manufacturing steps on the basis of the comparison such that future manufacturing of the solid layer of a like component conforms more closely to the desired geometry. For example, one or more parameters in the steps of providing a powder layer and/or selectively melting the powder layer may be adjusted, for example to ensure that the solidified layer more accurately conforms to its respective 2-D "slice" of designed CAD geometry.

After any errors in the geometry have been corrected (for example by bringing the geometry within an acceptable tolerance), the method may comprise re-scanning at least a part of the solid layer using the scanning electron beam to confirm that the geometry is now within an acceptable tolerance. For example, the entire solid layer may be re-scanned, or just the region(s) around any error(s) may be re-scanned.

For arrangements in which the energy source used to selectively melt the powder layer is a melting electron beam, the power of the melting electron beam may be greater than the power of the scanning electron beam.

The scanning electron beam may be used to determine the geometry of the solid layer without performing further, unwanted, melting. Thus, the power of the scanning electron beam may be insufficient to perform selective melting of the powder layer, but (where present) the power of the melting electron beam may be sufficient to perform selective melting of the powder layer.

Accordingly, even where a melting electron beam is used to selectively melt the powder layer, providing separate electron beams for melting and for determining the geometry means that both beams can be optimized for their specific purpose. This means that, for example, the power of the scanning electron beam used to determine the geometry can be optimized for high resolution. Thus, the geometry can be determined to high accuracy.

Where a melting electron beam is used to selectively melt the powder layer, the intensity of the scanning electron beam may be lower than the intensity of the melting electron beam. Providing the scanning electron beam as lower intensity beam (for example a beam with a narrower energy distribution profile and/or lower maximum intensity) may allow a higher resolution scan of the solid layer, and thus may allow the geometry to be determined with greater accuracy.

Where a melting electron beam is used to selectively melt the powder layer, the electron beam source for generating the scanning electron beam may be the same as the electron beam source for generating the melting electron beam. For example, at least one parameter may be changed for generating the melting beam as opposed to the scanning beam, such as the power used by the source to generate the beams. This may result in a particularly compact and/or low cost additive layer manufacturing machine.

Alternatively, the electron beam source for generating the scanning electron beam may be different to the electron beam source for generating the melting electron beam.

Nevertheless, the two electron beam sources may be a part of the same additive layer manufacturing machine.

Where a melting electron beam is used, it may selectively melt more than one area of the powder layer substantially simultaneously. In this way, the selective melting step may comprise generating multiple melt pools in the powder layer substantially simultaneously. Purely by way of example, up to 50 or 100 melt pools may be generated simultaneously. This may be achieved in any suitable manner. For example, the melting electron beam may be rapidly moved around the powder layer to generate multiple weld pools substantially simultaneously. Additionally or alternatively, the melting electron beam may in fact comprise multiple beams that are focussed on the powder layer substantially simultaneously in order to generate multiple weld pools at a given time. Such multiple beams, where used, may be generated by splitting a single generated beam or by generating multiple beams, for example. Where present, such multiple beams fall within the term "melting electron beam" as used herein.

In all aspects, the powder layer may be an electrically conductive powder layer. The powder layer may comprise any electrically conductive particles, for example any particles whose surface at least is electrically conductive. The powder layer may be a metal powder layer, as referred to elsewhere herein. The solid layer may be a solid metallic layer, as referred to elsewhere herein. A metal powder layer may comprise any desired metallic powder grains or particles. For example, the metal powder may comprise solid metal particles and/or metal-coated particles.

The method may comprise storing/recording (for example electronically) data relating to the layer scanned by the scanning electron beam, for example storing data relating to the determined geometry of the solid layer. For example, the determined geometry and/or the location and/or shape/size of any areas that are outside an acceptable and/or correctable tolerance may be stored. Such location information may include, for example, the layer in which the determined geometry was found to be outside an acceptable and/or correctable tolerance and the position(s) within that layer. The data relating to the layer scanned by the scanning electron beam may be recorded regardless of whether or not the geometry is subsequently corrected. This may avoid the need to perform additional inspection or testing after the component has been manufactured.

Such stored data may be used to determine whether the determined geometry has errors that are outside an allowable tolerance of a desired geometry at the same position in two or more different respective solid layers, such geometry being said to have recurring errors. If any such recurring errors have been identified, one or more parameters of the selective melting step and/or the step of providing the powder layer may be adjusted so as to avoid future recurring errors at that position. Such parameters may include, for example, the power and/or intensity of the energy source used to selectively melt the powder layer (for example the local power) and/or, where the energy source is an energy beam, the scanning (or rastering) speed of the energy beam, and/or the path (including the turning positions and/or rates) of the energy beam.

An image of the solid layer may be generated. The image may be stored for future reference. The image may be used to decide on the fate of the component, for example whether to try to correct any geometry that is outside the allowable tolerance, whether to scrap the component, or whether to proceed without taking any action (for example because the geometry is within an acceptable tolerance).

Optionally, the method may comprise identifying defects in the solid layer from detected backscattered electrons. The backscattered electrons may be the backscattered electrons resulting from the interaction of the scanning electron beam with the solid layer. Alternatively, a separate electron beam may be used to interact with the solid layer in order to identify defects to that which is used to determine the geometry of the solid layer. Optionally, the method may comprise removing any defects (for example using the melting electron beam) before providing the next powder layer. Thus, the method may allow both the geometry and the quality of a solidified layer to be determined and checked before proceeding with the next powder layer.

According to an aspect, there is provided a method for manufacturing a component, the method comprising repeating the steps described herein for multiple powder layers. Such a component may be said to be manufactured in a "layerwise" manner, that is to say by forming one solid (for example metallic) layer on top of another layer. The component may be a metallic component. The built-up shape corresponding to the component may actually be the component itself, or may be a shape that requires one or more further manufacturing and/or finishing steps (such as, by way of example only, machining or HIP) in order to produce the final component. The part-built component may be moved (or stepped) away from the electron beam source before the next layer of powder material is provided.

The method may comprise generating a virtual 3-D model of the manufactured component using stored data relating to the determined geometry of the solid layers. This may allow the precise geometry of the final component to be determined using in-situ measurements during manufacture, rather than requiring an additional measurement step, for example using CMM.

The method may comprise comparing such a virtual 3-D model of the manufactured component with desired geometry of the component. If the virtual 3-D model is determined to be outside an allowable tolerance the desired geometry, the method may comprise deciding whether to scrap the component or to correct the component. For example, the component may be corrected to become within an acceptable geometric tolerance using any suitable method, such as machining or selective re-melting using the energy source. The comparison between a virtual 3-D model of the manufactured component and the desired geometry may be electronic, and may not require physical measurement of the manufactured component, for example using CMM.

An additive layer manufacture machine according to the invention may further comprise a control unit (or processor) arranged to execute any one or more of the steps of the invention. For example, such a control unit may be arranged to execute any one or more of the following:

controlling the powder delivery device and/or the energy source and/or the electron beam source;

determining the geometry of the solid layer from the received backscattered electrons;

comparing the determined geometry of the solid layer with desired geometry;

deciding whether the determined geometry is within an allowable tolerance of the desired geometry;

deciding whether the solid layer is correctable if it is outside an allowable tolerance;

recognizing recurring geometrical errors that appear in the same position in two or more solid layers, and adjusting one or more parameters of the powder layer delivery and/or selectively melting so as to avoid future recurring errors at that position; and generating a virtual 3-D model of the completed component from the determined geometry of the solid layers, and optionally comparing the geometry of the virtual 3-D model with the desired geometry of the component.

According to an aspect of the invention, there is provided a component manufactured using a method comprising the steps described and/or claimed herein. According to an aspect of the invention, there is provided a component manufactured using an ALM machine as described and/or claimed herein.

BRIEF DESCRIPTION OF THE DRAWINGS

Embodiments of the invention will now be described with reference to the accompanying drawings, in which.

DETAILED DESCRIPTION OF THE PREFERRED EMBODIMENTS

As explained elsewhere herein, additive layer manufacturing (ALM) methods may be used to manufacture components by sequential selective melting of thin powder layers. For example, an EBM machine may be used to manufacture a metallic component by sequential selective melting of thin metal powder layers.

Figure 1:
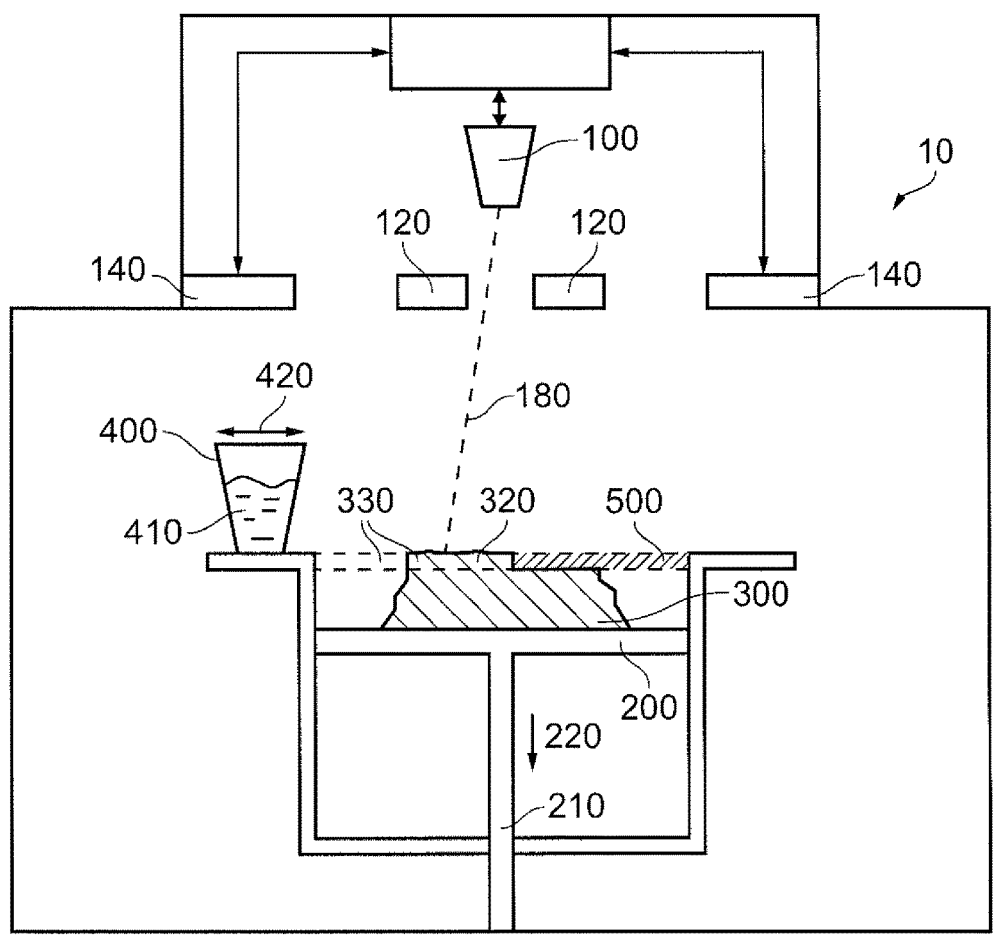
FIG. 1 shows an additive layer manufacture machine in accordance with the invention being used for selective melting.

An example of an additive layer manufacturing machine (or ALM machine) 10 for use in such a method is shown in FIG. 1. The ALM machine 10 comprises an electron beam source 100 for generating an electron beam 180 (which may be referred to as a melting electron beam). In use, the electron beam 180 is focussed using focusing elements 120, such as lenses and/or mirrors, towards a component 300 being manufactured. Specifically, the electron beam 180 is focussed onto a layer of powder (for example a layer of powder metal) 500 to be melted by the electron beam 180 which subsequently melts to form a solid layer (for example a solid metal layer) of the component 300. The powder layer 500 is provided to a melt region 330 of the ALM machine 10. The electron beam 180 is an example of an energy beam used to selectively melt the powder layer 500 in the melt region 330. The interior of the ALM machine 10, or at least the part of the interior of the ALM machine 10 through which electron beams travel may be a vacuum, or at least a partial vacuum.

In operation, the melting electron beam 180 scans over the metal powder layer 500 in the melt region 330 in a desired pattern so as to selectively melt the metal powder layer 500 in the correct shape required to manufacture that particular layer, or slice, of the component 300. Thus, the electron beam 180 may be said to be focussed on the melt region 330. The melted metal then solidifies to form a layer 320 of the component 300 in the desired shape. Thus, at least a part of the metal powder layer 500 is brought into a temporary molten state by the energy provided by the melting electron beam 180 such that when the material solidifies it forms at least part (in the form of a layer) of the component 300 being manufactured.

In FIG. 1, a part of the powder layer 500 has been selectively melted and solidified so as to form a part of a solid layer 320 of the component 300. Thus, FIG. 1 shows the component 300 part way through selective melting of the powder layer 500 to form the latest solid layer 320.

The component 300 may sit on a base plate 200 that sits on a translatable support 210, as in the FIG. 1 example. The translatable support 210 may be moved using any suitable means in a direction 220 that is substantially perpendicular to the layers 320 of the component 300. After each layer 320 is completed, the translatable support 210 moves by a predetermined distance in the direction 220 that is substantially perpendicular to the layer 320. Thus, the base plate 200 and the component 300 also move in the direction 220, and may be said to be indexed downwards (for example away from the electron beam source 100).

After the translatable support 210 has been indexed downwards, another layer of metal powder is supplied on top of the previous completed, solidified, layer 320. Purely by way of example, a hopper 400 containing metal powder 410 may be moved across the top of the previous solidified layer 320, depositing the next layer of powder material 500 as it moves, as shown in FIG. 1 by way of example. In FIG. 1, the direction arrow 420 indicates the direction of movement of the hopper 400 across the component 300. Of course, the hopper 400 may move relative to the component 300 in directions other than indicated by arrow 420 in FIG. 1, for example to ensure full (or the desired) coverage of metal powder 410 in a metal powder layer 500. Such a process may be known as powder bed deposition. However, any other method or system may be used to deposit the next layer of powder material 500 without impacting upon any other aspect or feature of the invention. For example, the hopper 400 containing the metal powder 410 may be fixed, and the powder 410 may be distributed into a layer 500 using a powder spreading device (not shown). Such a powder spreading device may comprise a rake that collects powder from a hopper and then distributes the powder over the support 210 or previously solidified layer 320 (which may be referred to as the melt region 330).

The powder material 500 comprises powder particles. The powder particles may be of varying sizes. The powder particles may be spherical, or generally spherical. The powder particles may be any suitable material. The powder particles may be conductive powder particles. For example, the powder particles may be metallic powder particles. The term metallic powder particles may mean that the metal powder particles are solid metal particles, or metal coated particles, for example. Where the particles are metallic particles, any suitable metal may be used. Purely by way of example, the particles may comprise or consist of titanium and/or a titanium alloy and/or nickel and/or a nickel alloy. The thickness of the powder layer 500 may be dependent on the application, for example the type of component being manufactured and/or the type of ALM machine 100 being used. Purely by way of example, the powder layer 500 may have a thickness in the range of from 0.01 mm to 1 mm, for example 0.02 mm to 0.5 mm, for example 0.05 mm to 0.25 mm, for example 0.07 mm to 0.2 mm. However, it will be appreciated that powder layer thickness outside this range may be used.

Figure 2:
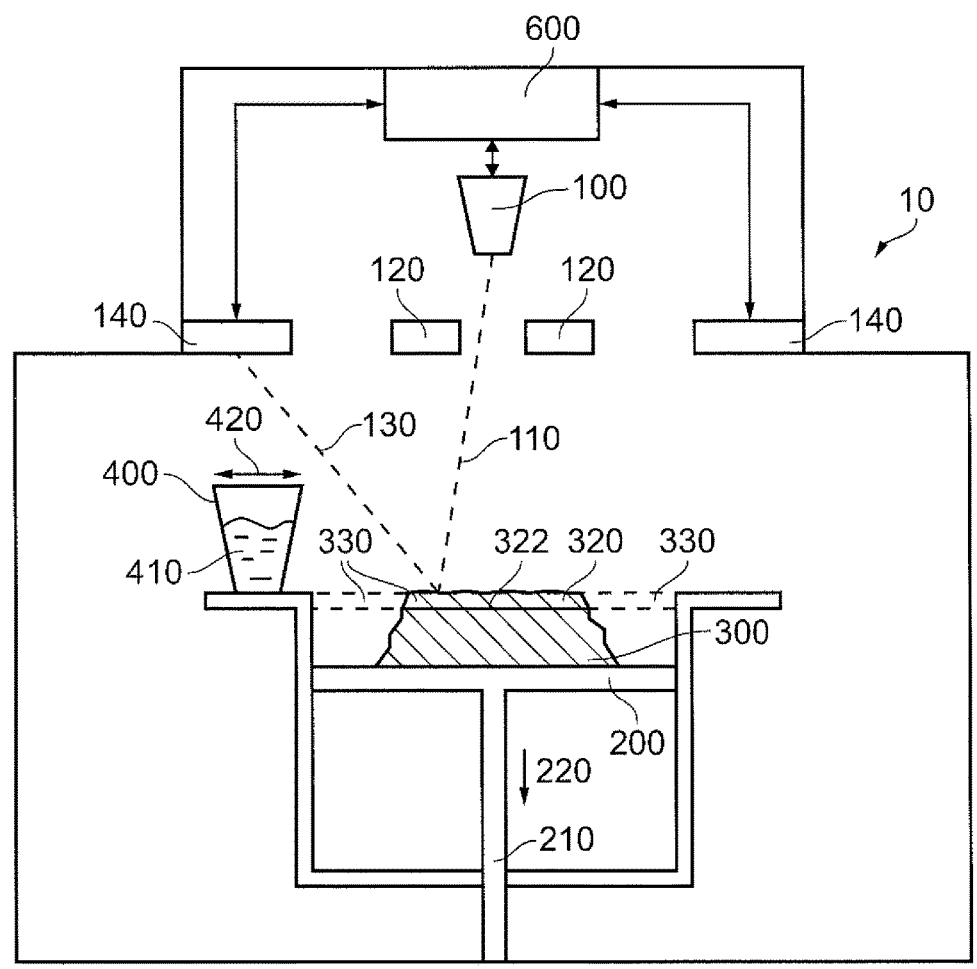
FIG. 2 shows an additive layer manufacture machine in accordance with the invention being used for determining geometry and/or detecting defects in a solid layer.

According to an aspect of the invention, after a powder layer 500 has been melted and has subsequently solidified to form a solid layer 320, the solid layer 320 is inspected so as to determine the geometry of the solid layer 320. An example of such an inspection of the solid layer 320 is shown in FIG. 2. Note that in FIG. 2, the line labelled 322 is for diagrammatic purposes only, in order to mark the extent of the solid layer 322, and is not intended to represent a physical feature of the component 300.

In FIG. 2, an electron beam 110 (also referred to as a scanning electron beam 110) is focused on the solid layer 320 after it has been formed by selective melting of the powder layer 500. The interaction between the scanning electron beam 110 and the solid layer 320 causes backscatter electrons 130 to be generated. The backscatter electrons 130 are detected by one or more backscatter detectors 140. The detected backscatter electrons 130 may be used to determine the shape (and optionally structure) of the solid layer 320. For example, as explained elsewhere herein, the backscatter electrons 130 may be used to determine whether the geometry of the solid layer 320 is different to the desired (or designed) geometry, and if so by how much and/or in which locations.

In operation, the electron beam 110 may scan across the solid layer 320 (that is, it may scan across the top surface of the component 300), thereby determining the shape of at least a part, for example all, of the upper surface of the component 300, i.e. the shape of the upper solid layer 320. Such a process may be known as rastering the electron beam 110 across the solid layer 320. In this way, the electron beam 110 may be said to act like a scanning electron microscope.

The backscatter detector(s) 140 may measure, for example, the intensity of the interaction of the scanning electron beam 110 with the solid layer 320 and/or electromagnetic radiation released as a result of the scanning electron beam 110 impinging on the solid layer 320. The interaction of the scanning electron beam 110 with the solidified layer 320 will be different to the interaction of the scanning electron beam 110 with an area that has not been selectively melted and solidified, and this difference results in a corresponding difference in the backscattered electrons 130, which is identified by the backscatter detector 140.

The backscatter detector(s) 140 may be in communication with a processor 600, as shown by way of example in the FIG. 2 arrangement. The processor 600 (which may be referred to as and/or may comprise a control unit) may be used to determine the geometry (or shape) of the immediately previously melted and solidified solid layer 320 from the back scatter electrons 130.

Figures 3A, 3B:
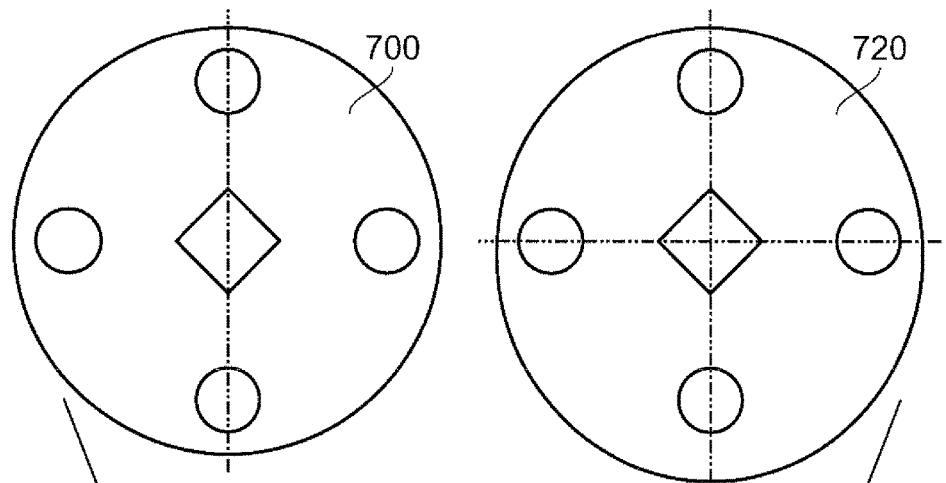
FIGS. 3A-3C show, respectively, a desired geometry of a solidified layer of a component, the actual geometry of the solidified layer, and an overlay of the desired and actual geometry of the solidified layer.
Figure 3C:
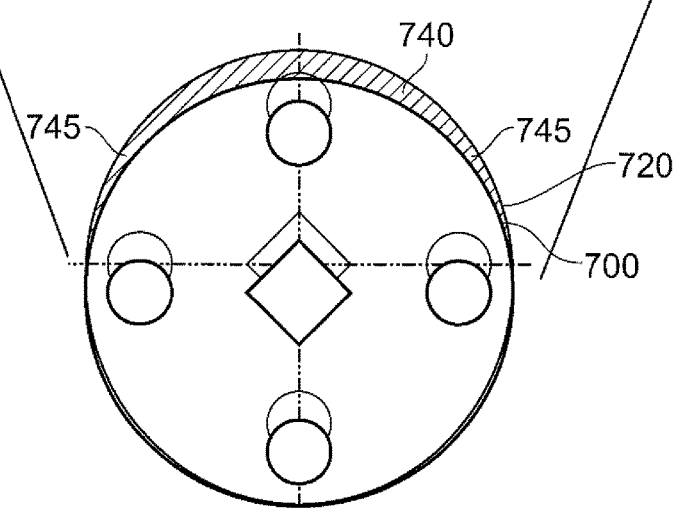

FIG. 3 shows a comparison between an actual image 720 of a solid layer 320 of a component 300 as manufactured and the shape 700 of the same layer 320 of the component 300 as designed. Specifically, FIG. 3A shows the shape 700 of the layer as designed, for example the shape 700 may be a 2-D slice through a CAD model of the component 300 to be manufactured using ALM. FIG. 3B shows schematically an image 720 of the shape of the solid layer 320 as manufactured using ALM, as determined for example by detecting the backscatter electrons 130 generated by the interaction between the scanning electron beam 110 and the solid layer 320. FIG. 3C shows an overlay of the desired shape 700 shown in FIG. 3A and the image 720 of the actual shape of the solid layer 320 shown in FIG. 3B.

As shown most clearly in FIG. 3C, the actual layer 320 is a different shape to the design intent. There may be many different reasons for this difference, with any one or more of the many different steps involved in the complex ALM process contributing. Purely by way of example, the difference in geometry may be due at least in part to thermal distortion, an example of which results from shrinkage of selectively melted powder 500 when it cools and solidifies to form the solid layer 320. This shrinkage needs to be accounted for when determining the parameters of the selective melting step (such as path and/or shape of a melting beam). If this shrinkage is under-estimated, over-estimated, or in any other way mis-calculated, the manufactured shape of the solid layer 320 may be different to the design intent 700, as shown by way of example in FIG. 3C.

Additionally, or alternatively, the shape of the solid layer 320 may be different to the desired shape due to unwanted variations in the manufacturing steps, for example unwanted variation in process parameters.

The present invention may involve comparing the desired and manufactured shapes of the layer 320, as shown in FIG. 3C by way of example. The comparison may be a comparison of electronic data representing the desired and manufactured shapes and/or may be performed automatically, for example using a control unit such as the control unit 600 shown in FIG. 2. The comparison may involve determining whether the manufactured shape 720 is within an acceptable tolerance of the desired shape 700. This may involve determining particular areas and/or positions where the manufactured shape 720 is outside an acceptable tolerance of the desired shape 700. For example, in FIG. 3C, it may be determined that only the hashed region 740 is outside an acceptable tolerance, whereas the un-hashed regions 745 are within an acceptable tolerance.

If any region 740 is determined to be outside an acceptable tolerance, it may be determined (for example by the processor 600) whether that region is correctable so as to become within the acceptable tolerance for that region. Such a region and/or component having a correctable region may be said to be within a correctable tolerance. Purely by way of example, if a region is deemed to be outside an acceptable tolerance because the manufactured layer 320 is smaller than the desired geometry, then this may be correctable by using the heat source (such as the melting electron beam 180 in the FIG. 1 example) to melt an additional part of the powder layer 500. As such, correctable geometry may be corrected before proceeding.

The process of determining the geometry 720 of the solidified layer 320 using the scanning electron beam 110 may be repeated for the corrected geometry, and/or the process of comparing the measured (corrected) geometry with the desired geometry may be repeated. This may be performed before the base plate 200 is moved (or indexed) to the position for receiving the next powder layer 500, i.e. before the translatable support 210 is moved in the direction of arrow 220 in the FIG. 1 example.

In some cases, it may be deemed that a region is not correctable so as to become within tolerance. In such cases, the process may be stopped, and the component may be scrapped. As such, the in-situ detection of the un-correctable geometry may result in earlier scrapping of components than would otherwise be the case, thereby saving time and resource.

Regardless of how the process proceeds (for example whether the geometry is within an acceptable tolerance, and if not whether it is correctable), the comparison between the actual geometry 720 and the desired geometry 700 may be used to modify one or more parameters of the process used to generate that layer 320, for example for use in manufacturing future examples of that component. For example, the parameters of the heat source used to selectively melt the powder layer 500, such as the path and/or power of a melting electron beam 180, may be modified so as to ensure that future versions of the same layer 320 conform more closely to the desired geometry.

Also regardless of how the process proceeds, the process may involve storing data (for example electronic data) representing the measured geometry 720. For example, such data may be stored in the control unit 600, or in a separate memory. Such data may include images and/or coordinate data, for example. Where the geometry is corrected, data representing both the original, uncorrected solid layer 320 and the corrected solid layer 320 may be stored.

Such stored data (or information) may then be used (for example by a processor 600) to optimize parameters of the ALM process, such as, for example, the powder delivery process and/or the selective melting process. For example, if geometrical errors are detected in the same position within two or more different powder layers, then these may be deemed to be recurring errors, which may be addressed by changing one or more parameters of the ALM process.

Figure 4A:
FIGS. 4A-4C show, respectively, a desired geometry of a solidified layer of an aerofoil component, the actual geometry of the solidified layer, and an overlay of the desired and actual geometry of the solidified layer.
Figure 4B:
Figure 4C:
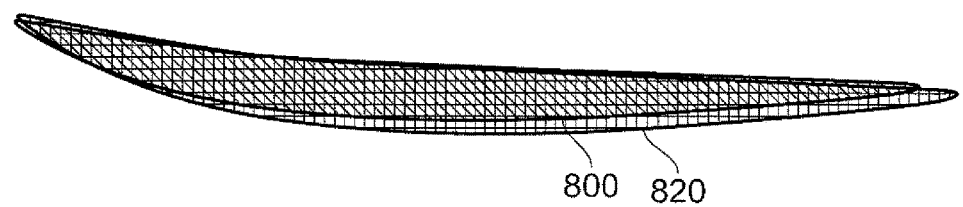

FIGS. 4A-4C show a comparison between an actual image 820 of a solid layer 320 of an aerofoil shaped component 300 as manufactured and the shape 800 of the same layer 320 of the aerofoil shaped component 300 as designed. Specifically, FIG. 4A shows the shape 800 of the aerofoil shaped layer as designed, for example the shape 800 may be a 2-D slice through a CAD model of an aerofoil component 300 to be manufactured using ALM. FIG. 4B shows schematically an image 820 of the shape of the solid aerofoil-shaped layer 320 as manufactured using ALM, as determined for example by detecting the backscatter electrons 130 generated by the interaction between the scanning electron beam 110 and the solid layer 320. FIG. 4C shows an overlay of the desired shape 800 shown in FIG. 4A and the image 820 of the actual shape of the solid layer 320 shown in FIG. 4B.

As such, FIGS. 4A-4C correspond to FIGS. 3A-3C, except in the shape of the layer 320 of the component being manufactured. FIGS. 4A-4C illustrate that the same process described above in relation to FIGS. 3A-3C may be applied to any suitable shape of component, as desired. The process of manufacturing and measuring the geometry of the solidified layer 320 in situ may be particularly beneficial when applied to aerofoil shaped components, which may require manufacture to particularly tight tolerance. Of course, all of the features and/or methods described herein (for example in relation to FIGS. 3A-3C) may apply to any shape of component, including aerofoil shapes such as that shown in FIGS. 4A-4C.

The scanning electron beam 110 may also be used to inspect the quality of the solid layer 320. Alternatively still, a further scanning electron beam may be used to inspect the quality of the solid layer 320. Accordingly, the back-scattered electrons 130 from the interaction of the scanning electron beam 110 with the solid layer 320 may be used to determine the topography of the solidified layer 320. The detector 140 may measure, for example, the intensity of the interaction of the scanning electron beam 110 with the layer 320 and/or electromagnetic radiation released as a result of the solid layer scanning electron beam 190 impinging on the layer 320.

Thus, the back-scattered electrons 130 as detected by the detector 140 may be used to identify any defects that may be present in the solidified layer 320. Such defects may include, for example, dimples and/or un-melted regions which may form porous zones in the finished component 300, and which may thus affect mechanical and/or geometrical properties of the finished component 300.

The detected back-scattered electrons 140 from the scanning electron beam 110 may thus be processed, for example using the processor 600, both to determine the geometry of the solid layer 320, and to identify defects in the solid layer 320. Imaging equipment may be used to show the topography of the surface of the layer 320 as determined by the detected back-scattered electrons 130.

Such imaging equipment may show defects as dark patches. The detected backscattered electrons 130 may be passed through an image processor, which may be a part of the processor 600. Such an image processor 600 may show dark patches where the detected back-scattered electrons 130 have a parameter above a threshold value, indicating a defect. Such a threshold may be calculated in any suitable manner, for example by comparing the brightness (or energy) at a position with the average brightness or energy across the image. It will be appreciated, however, that in some arrangements no image may be generated, and the information from the back-scattered electrons 130 may be acted upon directly.

If any defects in the solidified layer 320 have been identified, a decision may be taken as to how to address the defect. For example, at least a part of the layer 320 may be re-melted using the melting electron beam 180 in order to remove the defect(s). For example, all of the layer 320 may be re-melted or just the region of the defect (which may include a region surrounding the defect) may be re-melted. Before re-melting, additional metal powder 410 may or may not be added (for example in the region of the defect), for example using the hopper 400. The precise steps to be taken to remove a defect (such as which region to re-melt, the scanning path of the melting electron beam 180 required to perform the re-melting, and whether to provide more powder 410 to the defect region) may be controlled by the processor 600.

By way of further example, an identified defect may be simply left unchanged, and thus may not be removed. For example, once a defect has been identified, a decision may be made with regard to whether to remove the defect (for example by re-melting), or to leave the defect unchanged. The decision may be based on, for example, the size of the defect, for example the cross-sectional area of the defect and/or the depth of the defect. Additionally or alternatively, a decision regarding whether or not to remove a defect may be taken based on any other information, such as the shape of the defect (for example whether its shape would be likely to lead to any crack initiation or propagation), and/or the location of the defect (for example whether it will be at or near to a surface of the finished component 300).

As with geometrical errors in the solid layer 320, the decision as to whether to remove a given defect may be taken automatically (for example using an algorithm based on criteria such as those described herein), for example by the processor 600 based on the data provided from the detector 140. Additionally or alternatively, the decision may be taken by an operator.

After any identified defects have been removed as required, the layer 320 (or at least a part thereof, for example in the region of the identified defect(s)) may be re-scanned by the scanning electron beam 110 to check for any remaining defects. The process of identifying and optionally removing defects may then be iterated as required.

By identifying defects in-situ in the solidified layers 320, not only may post-manufacture testing/inspection be avoided, but the final component 300 may be of a higher quality. For example, if the identified defects are subsequently removed (as described above, for example), then the final component 300 would contain fewer defects than would otherwise be the case, and thus may be considered to be of higher quality. For example, the finished component 300 may contain fewer voids. This may enable the component 300 to be used for applications requiring higher quality components (for example with better mechanical properties, such as strength and/or stiffness and/or durability). Additionally or alternatively, identifying and removing defects in-situ may eliminate the need to perform additional manufacturing steps after the component 300 leaves the ALM machine 10. For example, identifying and removing defects in-situ may avoid the need to perform an additional HIP step that may otherwise be required. These advantages also apply the identification and optional correction of errors in the geometry of a solid layer 320, as described above, regardless of whether the step of identification and optional removal of defects in the solid layer 320 is also performed.

Regardless of the decision, data representing the solidified layer 320 that is gathered by the electron detector 140 from the back-scatter electrons 130 may be stored, for example as electronic data. Data and/or images may be stored for the entire component, for example for each layer 320. This may be in addition to any data that is stored representing the geometry of the solidified layer 320, described above. Accordingly, the need to perform additional inspection and/or testing after the component 300 has been manufactured may be avoided, thereby saving time and expense. Furthermore, performing in-situ identification of defects using the scanning electron beam 110 may be more accurate than conventional non-destructive inspection (such as X-ray inspection) of the finished component 300. This may be particularly advantageous for components with thick walls or cross-sections, for which conventional non-destructive inspection may have limited capability. Where appropriate, images and/or data relating to the scanned layer(s) 320 may be stored both for the original layer 320, and for the layer 320 after defects have been identified and removed.

Stored data representing the solidified layer 320 may be used to update and/or optimize the parameters of the selective melting step and/or the powder delivery step, for example for subsequent layers 320 and/or components 300. For example, the data may show that defects occur at the same position in different layers 320. If such defects were not removed, they may stack up on top of each other, leading to significant porosity, and may thus be referred to as "stacking defects". This may indicate that one or more parameters used to melt the layer 320 using the melting electron beam 180 needs to be changed, or optimized, in order to avoid the defects occurring at the corresponding positions in subsequent layers 320 and/or components 300. For example, a particular area of each layer 320 may not be receiving sufficient energy (for example energy per unit area or volume) from the melting electron beam 180 to correctly melt that area. In that case, one or more of many different parameters of the selective melting step may be adjusted to address the problem. Such parameters that may be adjusted include, for example, the power and/or intensity of the melting electron beam 180 and/or the scanning (or rastering) speed of the melting electron beam 180, and/or the path (including the turning positions and/or rates) of the melting electron beam. In this way, recurring defects may be avoided. Any one or more of the processing and/or control steps involved in identifying such "stacking defects" and adjusting parameters accordingly may be carried out by a processor 600.

Referring now back to FIGS. 1 and 2, where a melting electron beam is used as the energy source to selectively melt the powder layer, the scanning electron beam 110 and the melting electron beam 180 may be generated using the same electron beam generator 100. As described elsewhere herein, the properties of the scanning electron beam 110 and the melting electron beam 180 may be different, for example in terms of energy and/or intensity (for example peak intensity). Thus, where the same electron beam generator 100 is used, the properties of the electron beams 110, 180 may be controlled to be different, for example using the control unit 600.

However, it will be appreciated that many alternative arrangements falling within the scope of the invention are possible. For example, the energy for melting the powder layer 500 may be provided by a source other than an electron beam, for example from a laser. In such arrangements, the scanning electron beam source 100 would clearly be different to the source of the energy used to selectively melt the powder layer 500.

Figure 5:
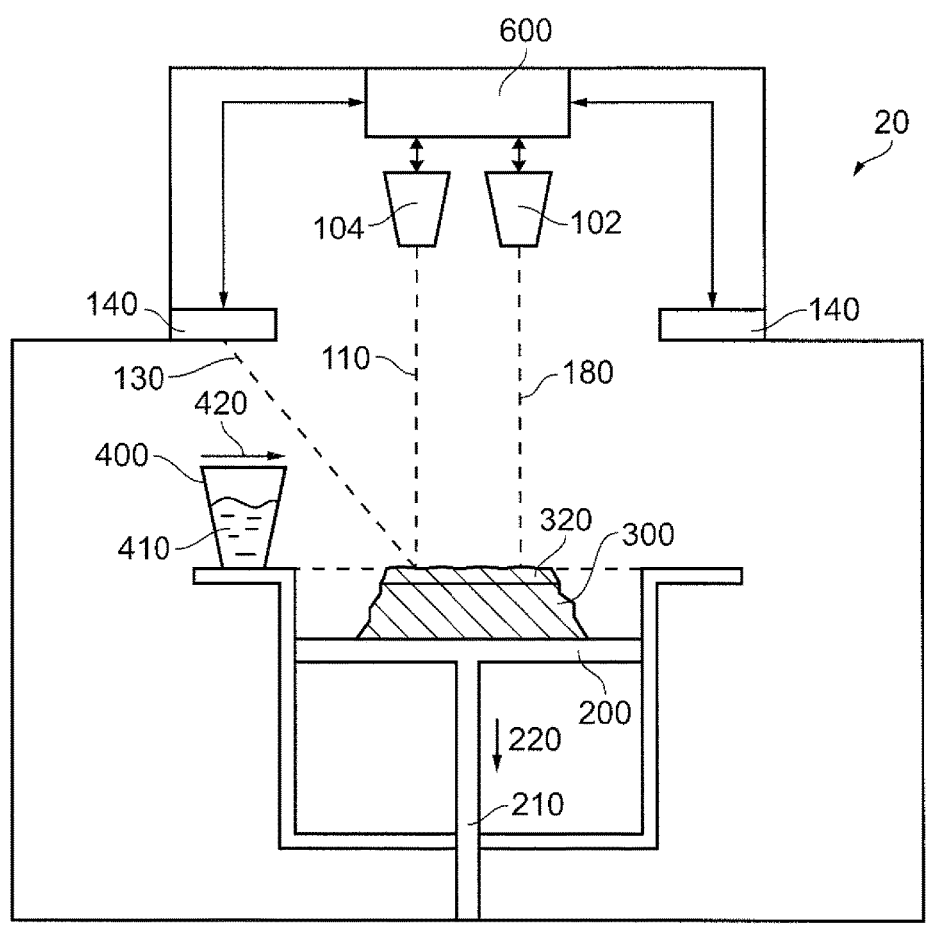
FIG. 5 shows another additive layer manufacture machine in accordance with the invention.

Even in arrangements in which a melting electron beam 180 is used to selectively melt the powder layer 500, different sources 102, 104 may be used to generate the melting electron beam 180 and the scanning electron beam 110, as shown in the ALM machine 20 of FIG. 5. The operation of the ALM machine 20 of FIG. 5, and the advantages associated therewith, is substantially the same as the ALM machine 10 discussed above, except in that the ALM machine 20 of FIG. 5 comprises two electron beam sources 102, 104, rather than just one electron beam source 100. As such, like features of the ALM machine 20 FIG. 5 and the ALM machine 20 of FIGS. 1 and 2 are given like reference numerals, and the discussion provided herein may relate to either example.

FIG. 5 shows both the melting and the scanning electron beams 180, 110, but it will be appreciated that the electron beams may operate at different times. For example, the melting electron beam 180 may be used to selectively melt a powder layer 500, and subsequently the scanning electron beam 180 may be used to inspect the solidified layer 320. However, the melting electron beam 180 may be generated by its electron beam source 102 at the same time that the scanning electron beam 110 is generated by its electron beam source 104. For example, the melting electron beam 180 may be used to selectively melt a part of a given powder layer 500 that then solidifies to form a part of the solid layer 320 that is geometrically inspected by the scanning electron beam 110 at the same time as the melting electron beam 180 is being used to selectively melt another part of the same powder layer 500.

The present invention allows the geometry of a component manufactured using ALM to be inspected in-situ as it is being manufactured, for example by determining the geometry of each layer 320 or for a selection of the layers 320. Additionally or alternatively, the present invention may allow the 3-D shape of the finished component 300 to be determined and/or checked after the ALM part of the manufacture has been completed. Any of the actions described herein in relation to in-situ measurement of the geometry of each layer 320 may also apply to the measurement of the geometry of the finished component 300. For example, after measurement, the component 300 may be approved, scrapped, or modified/corrected. Thus, the final inspection of the component manufactured using ALM may also be performed in-situ, without the need for additional measurement devices, such as CMM.

The proposed method and apparatus described herein may be used to manufacture any desired component using ALM, for example any suitable component of a gas turbine engine. Purely by way of example, the proposed method and apparatus may be used to manufacture aerofoil components (including turbine or compressor rotating blades or static stators), or other rotating or static structures. Indeed, the proposed method and apparatus may be used for a great many different components, across a great many different industries. Purely by way of non-limitative example, the proposed method and apparatus may be used to manufacture brackets, mountings and/or fixtures, gearboxes and components thereof, structural components for vehicles (such as roll hoops and/or impact bars for cars), fluid filters (such as oil filters), fluid injection equipment (such as oil jet nozzles), seals, heat exchangers, head and facial implants, and joint replacements (such as acetabular hip joints/cups) and may be used in any industry, such as aerospace, automotive and medical.

It will be appreciated that many alternative and/or optional features other than those explicitly described herein may fall within the scope of the invention. For example, it will be apparent that the invention may involve the use of many alternative configurations of ALM machine (for example in terms of layout, electron beam generators and/or detectors and relative movement of parts). Furthermore, any feature described and/or claimed herein may be combined with any other compatible feature described in relation to the same or another embodiment.

I claim:

1. A method of manufacturing and measuring the geometry of at least a part of a component using additive layer manufacture comprising:
    providing a powder layer to a melt region;
    selectively melting the powder layer using an energy source, the melted powder subsequently solidifying to form a solid layer;
    scanning the melt region, including the solid layer, using a scanning electron beam;
    detecting backscattered electrons resulting from the interaction of the scanning electron beam with the melt region;
    determining the geometry of the solid layer from the detected backscattered electrons;
    storing data relating to the determined geometry of the solid layer;
    using the stored data to determine whether the determined geometry has errors that are outside an allowable tolerance of a desired geometry at the same position in two or more different solid layers, such geometry being said to have recurring errors; and
    if any such recurring errors are identified, adjusting one or more parameters of the steps of providing a powder layer and/or selectively melting the powder layer so as to avoid future recurring errors at that position.

2. A method of manufacturing and measuring the geometry of at least a part of a component according to claim 1, further comprising:
    comparing the determined geometry of the solid layer with desired geometry of the solid layer; and
    deciding whether the determined geometry is within an allowable tolerance of the desired geometry, wherein:
    if it is decided that the determined geometry is within the allowable tolerance, repeating the preceding steps for at least one further powder layer.

3. A method of manufacturing and measuring the geometry of at least a part of a component according to claim 2, further comprising:
    if it is decided that the determined geometry is outside the allowable tolerance, deciding whether the determined geometry is correctable so as to become within the allowable tolerance; and
    if the determined geometry is deemed to be correctable, the geometry of the solid layer is corrected so as to be within the allowable tolerance before repeating the preceding steps for at least one further powder layer.

4. A method of manufacturing and measuring the geometry of at least a part of a component according to claim 3, wherein:
    if it is decided that the determined geometry is not correctable, no further powder layers are provided and the manufacture of the component stops.

5. A method of manufacturing and measuring the geometry of at least a part of a component according to claim 3, wherein if the determined geometry is deemed to be correctable, the solid layer is corrected at least in part using the energy source.

6. A method of manufacturing and measuring the geometry of at least a part of a component according to claim 1, further comprising:
    comparing the determined geometry of the solid layer with desired geometry of the solid layer; and
    adjusting one or more parameters of the steps of providing a powder layer and/or selectively melting the powder layer on the basis of the comparison such that future manufacturing of the corresponding solid layer of a like component conforms more closely to the desired geometry.

7. A method of manufacturing and measuring the geometry of at least a part of a component according to claim 1, wherein:
    the energy source used to selectively melt the powder layer is a melting electron beam; and
    the power of the melting electron beam is greater than the power of the scanning electron beam.

8. A method of manufacturing and measuring the geometry of at least a part of a component according to claim 1, wherein the powder layer is a metal powder layer and the solid layer is a solid metallic layer.

9. A method of manufacturing and measuring the geometry of at least a part of a component according to claim 1, further comprising:
    identifying defects in the solid layer from detected backscattered electrons.

10. A method of manufacturing a component comprising repeating the steps of claim 1 for multiple powder layers.

11. A method of manufacturing a component according to claim 10, further comprising generating a virtual 3-D model of the manufactured component using stored data relating to the determined geometry of the solid layers.

12. A method of manufacturing a component according to claim 11, further comprising:
    comparing the virtual 3-D model with desired geometry of the component; and if the virtual 3-D model is determined to be outside an allowable tolerance the desired geometry, deciding whether to scrap the component or correct the component.

13. An additive layer manufacture machine for manufacturing a component comprising:

a powder delivery device configured to deliver successive layers of powder to a melt region;

an energy source configured to selectively melt at least a part of each powder layer so as to produce a solid layer of the component;

an electron beam source configured to generate a scanning electron beam to scan each melt region, including the solid layer;

a backscatter detector configured to receive backscattered electrons resulting from the interaction between the electron beam and the melt region so as to be able to determine the geometry of the solid layer; and a control unit comprising a processor and memory, the control unit configured to:

store data relating to the determined geometry of the solid layer;

use the stored data to determine whether the determined geometry has errors that are outside an allowable tolerance of a desired geometry at the same position in two or more different solid layers, such geometry being said to have recurring errors; and if any such recurring errors are identified, adjust one or more parameters of the steps of providing a powder layer and/or selectively melting the powder layer so as to avoid future recurring errors at that position.

14. An additive layer manufacture machine according to claim 13, wherein the control unit is further configured to execute one or more of the following:

controlling the powder delivery device and/or the energy source and/or the electron beam source;

determining the geometry of the solid layer from the received backscattered electrons;

comparing the determined geometry of the solid layer with desired geometry;

deciding whether the determined geometry is within an allowable tolerance of the desired geometry;

deciding whether the solid layer is correctable if it is outside an allowable tolerance; and generating a virtual 3-D model of the completed component from the determined geometry of the solid layers, and optionally comparing the geometry of the virtual 3-D model with the desired geometry of the component.

15. An additive layer manufacture machine according to claim 13, wherein:

the energy source used to selectively melt the powder layer is a melting electron beam; and the power of the melting electron beam is greater than the power of the scanning electron beam.

16. A component manufactured using a method comprising the steps of claim 1.

17. A component manufactured using the apparatus of claim 13.

18. A method of manufacturing a component comprising:

providing a powder layer to a melt region;

selectively melting the powder layer using an energy source, the melted powder subsequently solidifying to form a solid layer;

scanning the melt region, including the solid layer, using a scanning electron beam;

detecting backscattered electrons resulting from the interaction of the scanning electron beam with the melt region;

determining the geometry of the solid layer from the detected backscattered electrons;

storing data relating to the determined geometry of the solid layer;

repeating the steps of providing a powder layer, selectively melting the powder layer, scanning the melt region, detecting backscattered electrons, and storing data relating to the determined geometry for multiple powder layers;

generating a virtual 3-D model of the manufactured component using the stored data relating to the determined geometry of the solid layers; and comparing the virtual 3-D model with desired geometry of the component, and if the virtual 3-D model is determined to be outside an allowable tolerance the desired geometry, deciding whether to scrap the component or correct the component.

19. A method of manufacturing and measuring the geometry of at least a part of a component according to claim 18, further comprising:

comparing the determined geometry of the solid layer with desired geometry of the solid layer; and adjusting one or more parameters of the steps of providing a powder layer and/or selectively melting the powder layer on the basis of the comparison such that future manufacturing of the corresponding solid layer of a like component conforms more closely to the desired geometry.

20. A method of manufacturing and measuring the geometry of at least a part of a component according to claim 18, wherein:

the energy source used to selectively melt the powder layer is a melting electron beam; and the power of the melting electron beam is greater than the power of the scanning electron beam.

* * * * *